(12) United States Patent
Yagi et al.

(10) Patent No.: US 8,445,912 B2
(45) Date of Patent: May 21, 2013

(54) THIN FILM TRANSISTOR STRUCTURE, METHOD OF MANUFACTURING THE SAME, AND ELECTRONIC DEVICE

(75) Inventors: Iwao Yagi, Kanagawa (JP); Hideki Ono, Tokyo (JP); Mari Sasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/028,604

(22) Filed: Feb. 16, 2011

(65) Prior Publication Data

US 2011/0204375 A1 Aug. 25, 2011

(30) Foreign Application Priority Data

Feb. 23, 2010 (JP) .................................. 2010-037284

(51) Int. Cl.
*H01L 29/10* (2006.01)

(52) U.S. Cl.
USPC .............. 257/59; 257/E27.111; 257/E29.151; 257/E51.005; 438/149; 438/30; 349/42; 349/43; 349/44; 349/45; 349/46; 349/47; 349/48

(58) Field of Classification Search
USPC ............. 257/59, E27.111, E51.005, E29.151; 438/149, 30; 349/42–48
See application file for complete search history.

(56) References Cited

U.S. PATENT DOCUMENTS

2002/0021403 A1* 2/2002 Kim et al. ..................... 349/187
2010/0090201 A1* 4/2010 Liu et al. ......................... 257/40

* cited by examiner

*Primary Examiner* — Steven Loke
*Assistant Examiner* — Cuong Nguyen
(74) *Attorney, Agent, or Firm* — Wolf, Greenfield & Sacks, P.C.

(57) ABSTRACT

A high-performance thin film transistor structure which is easily manufactured is provided. The thin film transistor structure includes: a first electrode; second and third electrodes apart from each other in a hierarchical level different from that of the first electrode; first, second, and third wirings connected to the first, second, and third electrodes, respectively; a main stack body disposed so as to be opposed to the first electrode with an interlayer insulating layer in between, between the first electrode, and the second and third electrodes; and a sub stack body including an insulating layer and a semiconductor layer, disposed so as to be opposed to the first wiring with the interlayer insulating layer in between, between the first and second wirings in a position where the first and second wirings overlap and/or between the first and third wirings in a position where the first and third wirings overlap.

18 Claims, 7 Drawing Sheets

THIN FILM TRANSISTOR STRUCTURE, METHOD OF MANUFACTURING THE SAME, AND ELECTRONIC DEVICE

BACKGROUND OF THE INVENTION

1. Field of the Invention

The present invention relates to a thin film transistor structure having a gate electrode, a source electrode, a drain electrode, wirings connected to the electrodes, and a semiconductor layer, a method of manufacturing the same, and an electronic device having the thin film transistor structure.

2. Description of the Related Art

In recent years, an active matrix driving method is introduced to many electronic devices typified by a display device such as a liquid crystal display (LCD). In the driving method, a thin film transistor (TFT) is used as an element for switching (pixel selection).

Among them, recently, attention is paid to a TFT using an organic semiconductor layer as a channel layer, and the TFT is called an organic TFT. In the organic TFT, a channel layer is formed by coating, so that cost is low. Since the channel layer is formed at a temperature lower than that in vapor deposition, the organic TFT is mountable on a low-heat-resistance flexible plastic film and the like.

A TFT is used for an electronic device as a part of a TFT structure, and the TFT structure has the TFT and a wiring connected to the TFT. The TFT includes, in addition to the channel layer, a gate electrode, a gate insulating layer, a source electrode, and a drain electrode. Wirings include a gate electrode wiring, a source electrode wiring, and a drain electrode wiring connected to the gate electrode, the source electrode, and the drain electrode, respectively.

To assure the performance of an electronic device using the TFT structure, it is necessary to prevent short circuit between the gate electrode for applying gate voltage and the source and drain electrodes for applying signal voltage (inter-electrode short-circuit). When an inter-electrode short-circuit occurs, a serious operation defect is caused. Causes of occurrence of the inter-electrode short-circuit include a pin hole which is opened in the gate insulating layer and a foreign matter which enters inside thereof.

To prevent the inter-electrode short-circuit, various examinations are being conducted. Concretely, the gate insulating layer in a region where the gate electrode, and the source electrode and the drain electrode overlap is made thicker than that in the other region (see, for example, Japanese Unexamined Patent Application Publication No. 2002-094071).

SUMMARY OF THE INVENTION

In recent years, as electronic devices are becoming smaller (higher integration) and performance is becoming higher, to assure and maintain the performance, it is important to prevent not only an inter-electrode short-circuit but also a short circuit between the gate electrode wiring and the source electrode wiring and the drain electrode wiring (inter-wiring short-circuit).

To prevent the inter-wiring short-circuit, in a manner similar to the case where the inter-electrode short-circuit is prevented, it is considered to make the gate insulating layer in the region where the gate electrode wiring, and the source electrode wiring and the drain electrode wiring overlap thicker than that in the other region. It is also considered to form an additional gate insulating layer to increase the total thickness of the gate insulating layers.

However, when the thickness of the gate insulating layer is increased, the performance of the TFT structure (such as the modulation characteristic of the TFT) deteriorates. When the additional gate insulating layer is formed, the number of processes of manufacturing the TFT structure increases.

It is therefore desirable to provide a high-performance thin film transistor structure which is easily manufactured, a method of manufacturing the same, and an electronic device.

A thin film transistor structure according to an embodiment of the invention has: a first electrode; second and third electrodes apart from each other in a hierarchical level different from that of the first electrode; first, second, and third wirings connected to the first, second, and third electrodes, respectively; a main stack body disposed so as to be opposed to the first electrode with an interlayer insulating layer in between, between the first electrode, and the second and third electrodes; and a sub stack body including an insulating layer and a semiconductor layer and disposed so as to be opposed to the first wiring with the interlayer insulating layer in between, between the first and second wirings in a position where the first and second wirings overlap and/or between the first and third wirings in a position where the first and third wirings overlap. An electronic device of an embodiment of the present invention has the above-mentioned thin film transistor structure of an embodiment of the invention.

A method of manufacturing a thin film transistor structure of an embodiment of the present invention includes the steps of: forming a first electrode and a first wiring connected to the first electrode; forming second and third electrodes apart from each other and second and third wirings connected to the second and third electrodes, respectively, in a hierarchical level different from that of the first electrode and the first wiring; forming an interlayer insulating film so as to cover the first electrode and the first wiring; forming a main stack body disposed so as to be opposed to the first electrode, on the interlayer insulating layer between the first electrode, and the second and third electrodes; and forming a sub stack body including an insulating layer and a semiconductor layer by forming a film by using a solution containing an insulating material and a semiconductor material, on the interlayer insulating layer between the first and second wirings in a position where the first and second wirings overlap and/or between the first and third wirings in a position where the first and third wirings overlap, and making phase separation occur in the film.

In the thin film transistor structure and the method of manufacturing the same of an embodiment of the present invention, the sub stack body is formed between the first and second wirings in a position where the first and second wirings overlap and/or between the first and third wirings in a position where the first and third wirings overlap. The sub stack body includes an insulating layer and a semiconductor layer. In this case, the substantial thickness of the insulating layer between the first wiring and the second and third wirings increases, occurrence of the inter-wiring short-circuit is suppressed. When the sub stack body is formed in the same process as that of the main stack body, the number of processes does not increase to form the sub stack body. Further, when the insulating layer is formed in the same process as that of the semiconductor layer by using the phase separation in the film formed by the solution including the insulating material and the semiconductor material, the number of processes does not increase for forming the insulating layer. Therefore, the inter-wiring short-circuit is effectively prevented without increasing the number of manufacturing processes, so that the high-performance TFT structure is easily manufactured. In an electronic device formed by using the thin film transistor structure and the method of manufacturing the thin film transistor structure, a high-performance electronic device is manufactured easily.

Other and further objects, features and advantages of the invention will appear more fully from the following description.

DETAILED DESCRIPTION OF THE PREFERRED EMBODIMENTS

In the following, embodiments of the present invention will be described in detail hereinbelow with reference to the drawings. The description will be given in the following order.
1. thin film transistor structure (TFT structure) and a method of manufacturing the same
2. application example of TFT structure (electronic device)
   2-1. liquid crystal display device
   2-2. organic EL display device
   2-3. electronic paper display device
   1. TFT Structure and Method of Manufacturing the Same FIG. 1 illustrates a plane configuration of a TFT structure in an embodiment of the present invention, and FIGS. 2A and 2B illustrate sectional configurations taken along lines A-A and B-B, respectively, of the TFT structure shown in FIG. 1.

The TFT structure is obtained by, for example, stacking a gate electrode 2, a wiring 3 for the gate electrode, a gate insulating layer 4, a main stack body 5 and a sub stack body 6, a source electrode 7, a wiring 8 for the source electrode, a drain electrode 9, and a wiring 10 for the drain electrode in this order on a substrate 1. The wiring 3 for the gate electrode, the wiring 8 for the source electrode, and the wiring 10 for the drain electrode are connected to the gate electrode 2, the source electrode 7, and the drain electrode 9, respectively.

Figure 1:
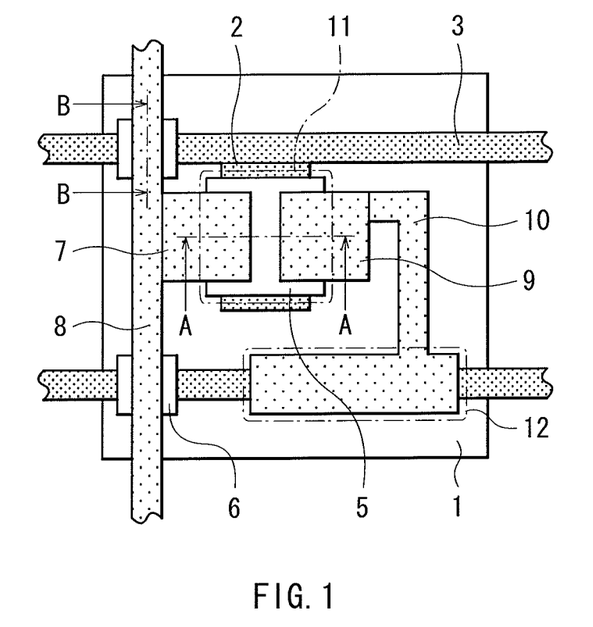
FIG. 1 is a plan view illustrating the configuration of a thin film transistor structure in an embodiment of the present invention.
Figure 2A:
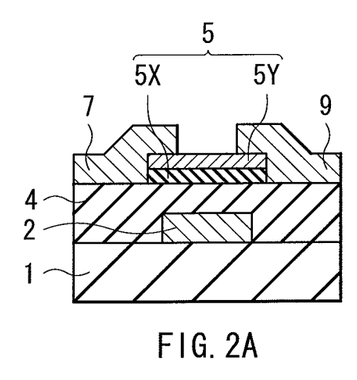
FIGS. 2A and 2B are cross sections taken along line A-A and B-B, respectively, of the thin film transistor structure illustrated in FIG. 1.
Figure 2B:
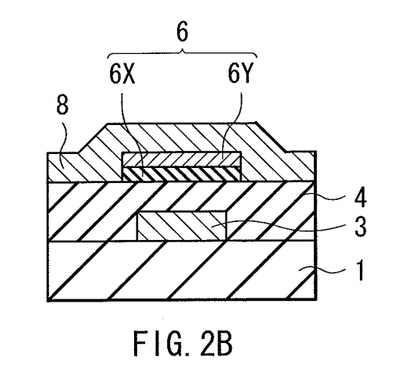

In FIG. 1, the gate electrode 2 and the wiring 3 for the gate electrode are densely hatched, and the source electrode 7, the wiring 8 for the source electrode, the drain electrode 10 and the wiring 9 for the drain electrode are coarsely hatched. The gate insulating layer 4 is not shown.

The substrate 1 may be, for example, a substrate made of glass, a plastic material, a metal material, or the like, a film made of a plastic material, a metal material, or the like, or paper (general paper). Examples of the plastic material include polyether sulfone (PES), polycarbonate (PC), polyimide (PI), polyethylene terephthalate (PET), polyethylene naphthalate (PEN), and polyetheretherketone (PEEK). Examples of the metal material include aluminum (Al), nickel (Ni), and stainless steel. The surface of the substrate 1 may be provided with any of various layers such as a buffer layer for assuring adhesion and a gas barrier layer for preventing gas release.

The gate electrode 2 (first electrode) is formed on the substrate 1 and is made of any one or more kinds of a metal material, an inorganic conductive material, an organic conductive material, and a carbon material. Examples of the metal material include aluminum, copper (Cu), molybdenum (Mo), titanium (Ti), chromium (Cr), nickel, palladium (Pd), gold (Au), silver (Ag), and platinum (Pt) and alloys containing the metal materials. Examples of the inorganic conductive material include indium oxide ($In_2O_3$), indium tin oxide (ITO), indium zinc oxide (IZO), and zinc oxide (ZnO). Examples of the organic conductive material include polyethylenedioxythiophene (PEDOT) and polystyrene sulfonate (PSS). The carbon material is, for example, graphite. The gate electrode 2 may be obtained by stacking two or more layers made of any of the above-described various materials. The wiring 3 for the gate electrode, the gate insulating layer 4, the source electrode 7, the wiring 8 for the source electrode, the drain electrode 9, and the wiring 10 for the drain electrode may be similarly obtained.

The wiring 3 for the gate electrode (first wiring) is formed of, for example, a material similar to that of the gate electrode 2. The wiring 3 for the gate electrode extends, for example, in the lateral direction in FIG. 1.

The gate insulating layer 4 (interlayer insulating layer) covers the gate electrode 2 and the wiring 3 for the gate electrode and is formed of one or more kinds of an inorganic insulating material and an organic insulating material. Examples of the inorganic insulating material include silicon oxide (SiOx), silicon nitride (SiNx), aluminum oxide ($Al_2O_3$), titanium oxide ($TiO_2$), hafnium oxide (HfOx), and barium titanate ($BaTiO_3$). Examples of the organic insulating material include polyvinylphenol (PVP), polyimide, polymethacrylate acrylate, photosensitive polyimide, photosensitive novolac resin, and polyparaxylylene.

The main stack body 5 is formed on the gate insulating layer 4 and is disposed so as to be opposed to the gate electrode 2 between the source electrode 7 and the drain electrode 9. The main stack body 5 has, for example, the same layer stack structure as that of the sub stack body 6. The main stack body 5 has, for example, a layer stack structure including an insulating layer 5X and a semiconductor layer 5Y in a manner similar to the sub stack body 6 (including an insulating layer 6X and a semiconductor layer 6Y) which will be described later. The semiconductor layer 5Y is a so-called channel layer. The details of the insulating layer 5X and the semiconductor layer 5Y are similar to those of the insulating layer 6X and the semiconductor layer 6Y, respectively.

The sub stack body 6 is formed on the gate insulating layer 4 and is disposed so as to be opposed to the wiring 3 for the gate electrode between the wiring 3 for the gate electrode and the wiring 8 for the source electrode in positions where they overlap each other.

Although not concretely shown, the sub stack body 6 may be formed in the position where the wiring 3 for the gate electrode and the wiring 10 for the drain electrode overlap. The positional relation between the wiring 3 for the gate electrode, the gate insulating layer 4, and the wiring 10 for the drain electrode and the sub stack body 6 in this case is similar to that between the wiring 3 for the gate electrode, the gate insulating layer 4, and the wiring 8 for the source electrode, and the sub stack body 6.

Obviously, the sub stack body 6 may be formed in the position where the wiring 3 for the gate electrode and the wiring 8 for the source electrode overlap and/or the position where the wiring 3 for the gate electrode and the wiring 10 for the drain electrode overlap.

The sub stack body 6 has a layer stack structure including the insulating layer 6X and the semiconductor layer 6Y. The sub stack body 6 has, for example, a two-layer structure in which the semiconductor layer 6Y is formed on the insulating layer 6X. The insulating layer 6X is adjacent to the gate insulating layer 4.

The material (insulating material) of the insulating layer 6X may be an organic material or an inorganic material. The material (semiconductor material) of the semiconductor layer 6Y may be similarly an organic material or an inorganic material. The insulating layer 6X (insulating material) and the semiconductor layer 6Y (semiconductor material) may be soluble or insoluble.

The insulating layer 6X and the semiconductor layer 6Y are obtained by, for example, phase separation which occurs in a film formed by using a solution containing the materials thereof (the insulating material and the semiconductor material). Specifically, in a process of forming the sub stack body 6, the insulating material and the semiconductor material dispersed or dissolved in the solution are separated from each other in the film. As a result, a layer formed in a lower part of the film, by the insulating material, becomes the insulating layer 6X, and a layer formed in an upper part of the film, by the semiconductor material, becomes the semiconductor layer 6Y.

As the insulating material, the following materials may be used. The inorganic material is, for example, silicon methoxide. When the silicon methoxide is fired, it becomes an insulating body (silicon oxide). The organic material is, for example, polyalphamethylstyrene. The insulating material may be a bridging material which performs photocrosslinking (for example, ultraviolet cross-link), thermal cross-linking, or the like.

As the semiconductor material, the following materials may be employed. The inorganic material is, for example, zinc methoxide. When zinc methoxide is fired, it becomes a semiconductor (zinc oxide). Examples of the organic material include, except for polythiophene, pentacene in which one or more triisopropylsilyl ethinyls (TIPS) are introduced (hereinafter called TIPS pentacene).

The sub stack body 6 is, for example, formed in parallel in the same process as that of the main stack body 5 and is positioned in the same level as the main stack body 5. The sub stack body 6 is separated (isolated) from the main stack body 5. The "level" denotes a level (height) of each layer in the case where a series of layers such as the gate insulating layer 4 are stacked on the substrate (the hierarchical structure is formed by the series of layers). Consequently, the expression "being positioned in the same level" denotes that the sub stack body 6 is positioned in the same height (level) as that of the main stack body 5 in the hierarchical structure.

The source electrode 7 (second electrode) and the drain electrode 9 (third electrode) are formed so as to be apart from each other on the gate insulating layer 4 and be in contact with the main stack body 5 (semiconductor layer 5Y) and are made of, for example, a material similar to that of the gate electrode 2. In this case, the source electrode 7 and the drain electrode 9 are, for example, connected so as to overlap on the main stack body 5 and, preferably, in ohmic-contact with the semiconductor layer 5Y.

The wiring 8 for the source electrode (second wiring) is formed of a material similar to that of the source electrode 7, and the wiring 10 for the drain electrode (third wiring) is formed of a material similar to that of the drain electrode 9. The wiring 8 for the source electrode and the wiring 10 for the drain electrode, for example, extend in the vertical direction in FIG. 1 and, for a reason of wiring or the like, cross the wiring 3 for the gate electrode in some midpoints.

The TFT structure has a TFT 11, and the TFT 11 includes the gate electrode 2, the gate insulating layer 4, the main stack body 5, the source electrode 7, and the drain electrode 9. The TFT 11 described here is of the bottom-gate top-contact type in which the gate electrode 2 is positioned below the main stack body 5, and the source electrode 7 and the drain electrode 9 overlap on the main stack body 5.

The TFT structure may have a capacitor (retention capacitor) 12 as necessary. The capacitor 12 includes, for example, the wiring 3 for the gate electrode, the gate insulating layer 4, and the wiring 10 for the drain electrode. Between the gate insulating layer 4 and the wiring 10 for the drain electrode, the sub stack body 6 may be provided. In the case where the TFT structure has some wiring other than the wiring 3 for the gate electrode, the wiring 8 for the source electrode, and the wiring 10 for the drain electrode, the gate insulating layer 4 and the sub stack body 6 may be provided between the wiring and the wiring 3 for the gate electrode or the like.

Method of Manufacturing TFT Structure

FIGS. 3A and 3B to FIGS. 5A and 5B are diagrams for explaining a method of manufacturing the TFT structure and illustrate sectional configurations corresponding to FIGS. 2A and 2B. Since the materials of the components of the TFT structure have been described already, their description will not be repeated below.

Figure 3A:
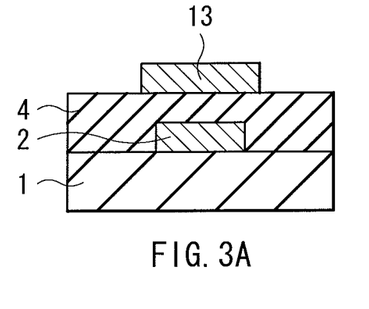
FIGS. 3A and 3B are cross sections for explaining a method of manufacturing the thin film transistor structure.
Figure 3B:
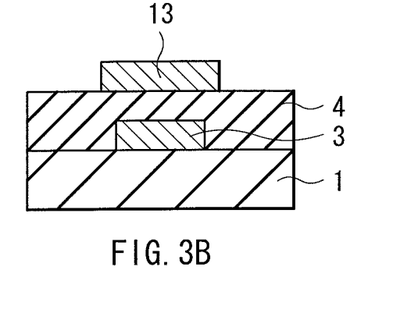

In the case of manufacturing the TFT structure, first, as shown in FIGS. 3A and 3B, the gate electrode 2 and the wiring 3 for the gate electrode are formed on the substrate 1. In this case, for example, a metal material layer is formed so as to cover the substrate 1 and, after that, a mask (not shown) such as a resist pattern is formed on the metal material layer. Subsequently, the metal material layer is etched using the mask and, after that, the mask is removed by using ashing, etching, or the like. As a method of forming the metal material layer, for example, the vacuum film forming method, the coating method, the plating method, or the like is used. Examples of the vacuum film forming method include vacuum evaporation, flash evaporation, sputtering, vapor deposition (PVD), chemical vapor deposition (CVD), pulse laser deposition (PLD), and arc-discharge evaporation. Examples of the coating method include spin coating, slit coating, bar coating, and spray coating. Examples of the plating method include electrolytic plating and electroless plating. In the case of forming a resist pattern, for example, a photoresist is applied to form a photoresist film. After that, the photoresist film is patterned by using photolithography, laser lithography, electron-beam lithography, X-ray lithography, or the like. The resist pattern may be formed by using a resist transfer method or the like. The method of etching the metal material layer is, for example, dry etching or wet etching using an etchant. The dry etching is, for example, ion milling, reactive ion etching (RIE), or the like. The method of etching for removing the mask is similar to the above-described etching method. Examples of a method of forming the gate electrode 2 and the like include ink jet printing, screen printing, gravure printing, and gravure offset printing. In place of the resist pattern, a metal pattern may be formed as the mask by using laser ablation, mask evaporation, laser transfer, or the like. Obviously, to form the gate electrode 2 and the like, in place of the metal material layer, an inorganic conductive material layer, an organic conductive material layer, a carbon material layer, or the like may be formed.

Subsequently, the gate insulating layer 4 is formed so as to cover the gate electrode 2 and the wiring 3 for the gate electrode. The procedure of forming the gate insulating layer 4 varies according to, for example, the material of forming the layer. The forming procedure in the case of using an inorganic insulating material is similar to that in the case of forming the gate electrode 2 or the like except that the coating method may be the sol-gel method or the like. The forming procedure in the case of using an organic insulating material is similar to that in the case of forming the gate electrode 2 or the like except that the photosensitive material may be patterned by using photolithography or the like.

Subsequently, a solution (mixed solution) obtained by dispersing or dissolving the insulating material and the semiconductor material in a solvent such as an organic solvent is prepared. In this case, the kind of the insulating material and that of the semiconductor material, combination and composition (mixing ratio) of the materials, and the like are determined so that the main stack body 5 and the sub stack body 6 are formed by using phase separation in a later process. In the case of using polyalphamethylstyrene as the insulating material and using TIPS pentacene as the semiconductor material, toluene, xylene, mesitylene, tetralin, or the like is used as the solvent.

Subsequently, the mixed solution is applied on the surface of the gate insulting layer 4 and heated (fired) to form a mixed layer 13. In this case, for example, the mixed layer 13 is formed so as to cover the gate insulating layer 4 and, after that, the mixed layer 13 is etched using the mask. The mask forming method and the method of etching the mixed layer 13 are similar to, for example, the case of forming the gate electrode 2.

Figure 4A:
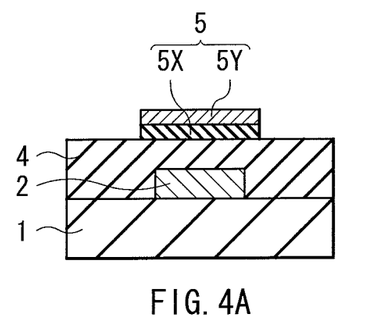
FIGS. 4A and 4B are cross sections for explaining a process subsequent to FIGS. 3A and 3B.
Figure 4B:
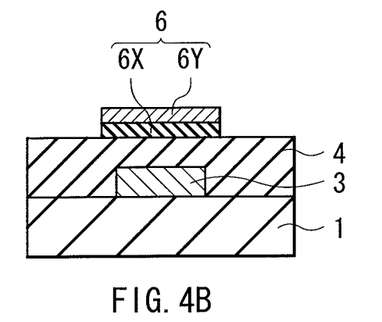

By the firing, phase separation occurs in the mixed layer 13, so that the insulating material and the semiconductor material are thermally separated from each other. The firing temperature in this case is settable to arbitrary temperature in accordance with the parameters such as the kinds and compositions of the insulating material and the semiconductor material. The insulating material moves downward and is formed in a film and the semiconductor material moves upward and is formed in a film in the mixed layer 13, so that the main stack body 5 and the sub stack body 6 having the same layer stack structure are formed in one (the same) process as shown in FIGS. 4A and 4B. Specifically, the main stack body 5 (the insulating layer 5X and the semiconductor layer 5Y) is formed in the region opposed to the gate electrode 2, the sub stack body 6 (the insulating layer 6X and the semiconductor layer 6Y) is formed in the region opposed to the wiring 3 for the gate electrode. The phase separation may occur for the first time at the time of firing or may occur at the time of coating the mixed solution and may be completed by the time of firing.

The details of the method of forming a multilayer film using the above-described phase separation are reported in Applied Physics Letters by T. Ohe et al (T. Ohe et al., Applied Physics Letters 93, p. 053303, 2008).

Figure 5A:
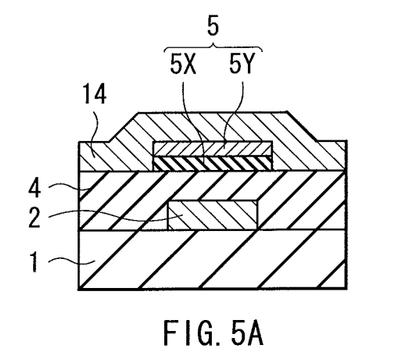
FIGS. 5A and 5B are cross sections for explaining a process subsequent to FIGS. 4A and 4B.
Figure 5B:
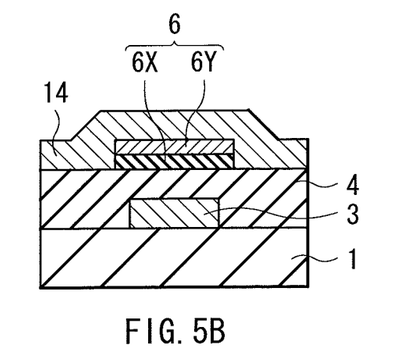

Subsequently, as shown in FIGS. 5A and 5B, an electrode layer 14 is formed so as to cover the main stack body 5, the sub stack body 6, and the gate insulating layer 4 in the periphery of the bodies 5 and 6. The electrode layer 14 is a preparation layer for forming the source electrode 7, the wiring 8 for the source electrode, the drain electrode 9, and the wiring 10 for the drain electrode. As the material of forming the electrode layer 14, the material similar to that of the source electrode 7 or the like is used. The method of forming the electrode layer 14 is similar to, for example, that in the case of forming the gate electrode 2. A method which hardly damages the main stack body 5 and the sub stack body 6 is preferable.

Finally, the electrode layer 14 is selectively etched to form the source electrode 7, the wiring 8 for the source electrode, the drain electrode 9, and the wiring 10 for the drain electrode as illustrated in FIGS. 2A and 2B. In this case, a procedure similar to that in the case of forming the gate electrode 2 and the wiring 3 for the gate electrode is used. Concretely, a resist pattern or the like is formed on the electrode layer 14 and, using it as a mask, the electrode layer 14 is etched. In particular, a preferred method of etching the electrode layer 14 is, for example, wet etching which hardly damages the main stack body 5 and the sub stack body 6. By the procedure, the TFT structure is completed.

Operation and Effect on TFT Structure and Method of Manufacturing TFT Structure

In the TFT structure and the method of manufacturing the same, in the position where the wiring 3 for the gate electrode and the wiring 8 for the source electrode overlap, the sub stack body 6 is formed between the gate insulating layer 4 and the wiring 8 for the source electrode. The sub stack body 6 has a layer stack structure including the insulating layer 6X and the semiconductor layer 6Y. Therefore, the high-performance TFT structure is easily manufactured for the following reasons.

Figure 6:
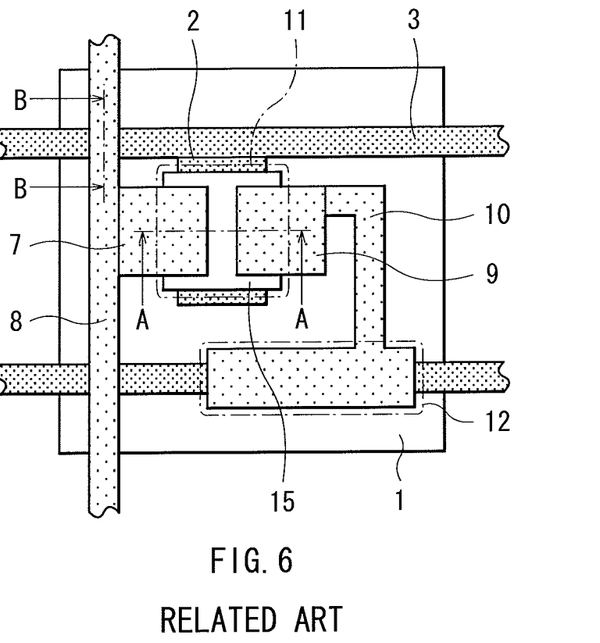
FIG. 6 is a plan view illustrating the configuration of a thin film transistor structure of a comparative example.
Figure 7A:
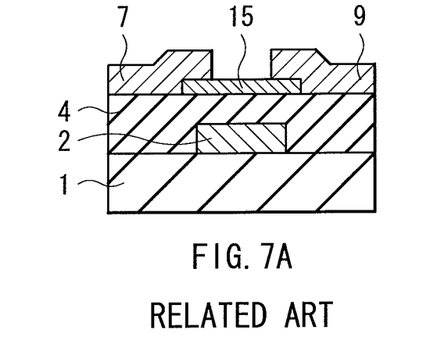
FIGS. 7A and 7B are cross sections taken along line A-A and B-B, respectively, of the thin film transistor structure illustrated in FIG. 6.
Figure 7B:
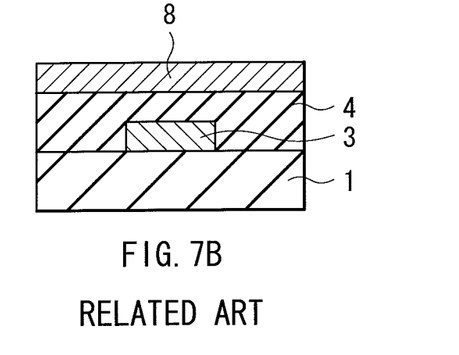

FIG. 6 and FIGS. 7A and 7B illustrate the configuration of a TFT structure of a comparative example and correspond to FIG. 1 and FIGS. 2A and 2B, respectively. The TFT structure of the comparative example has a configuration similar to that of the TFT structure of the embodiment except that a semiconductor layer 15 is provided in place of the main stack body 5 and the sub stack body 6 is not provided. The semiconductor layer 15 is made of a general semiconductor material used for the channel layer.

In the TFT structure of the comparative example, as shown in FIG. 6 and FIGS. 7A and 7B, only the gate insulating layer 4 is formed between the wiring 3 for the gate electrode and the wiring 8 for the source electrode. In this case, an inter-wiring short-circuit (short-circuit between the wiring 3 for the gate electrode and the wiring 8 for the source electrode) tends due to a pin hole or the like generated in the gate insulating layer 4. In particular, in the case where the gate insulating layer 4 is formed by the vacuum film forming method such as sputtering, a pin hole tends to be formed on the inside so that the possibility of an inter-wiring short-circuit is high.

In contrast, in the TFT structure of the embodiment, as shown in FIG. 1 and FIGS. 2A and 2B, the sub stack body 6 (insulting layer 6X) is formed between the wiring 3 for the gate electrode and the wiring 8 for the source electrode. In this case, the substantial thickness of the insulating layer between the wiring 3 for the gate electrode and the wiring 8 for the source electrode increases as compared with the case where the insulating layer 6X is not formed, so that occurrence of the inter-wiring short-circuit is suppressed.

The sub stack body 6 is formed in the same process as that of the main stack body 5 as the main part of the TFT 11. Consequently, the number of processes does not increase to form the sub stack body 6. Moreover, the main stack body 5 and the sub stack body 6 are formed by using the phase separation using the mixed solution. Since the insulating layer 5X is formed in the same process as that of the semiconductor layer 5Y as the main part of the TFT 11, the number of processes does not also increase to form the insulating layer 5X.

In addition, the sub stack body 6 including the insulating layer 6X is formed by using the mixed solution containing the insulating material and the semiconductor material. Consequently, the mixed solution penetrates the gate insulating layer 4 in the process of forming the sub stack body 6, and a pin hole which is opened in the gate insulating layer 4 is buried. In this case, as obvious from the fact that the insulating layer 6X is formed as a lower layer (adjacent to the gate insulating layer 4) in the sub stack body 6, the insulating material in the mixed solution preferentially penetrates the gate insulating layer 4, so that the pin hole is buried by the insulating material. Due to this, even when the mixed solution penetrates the gate insulating layer 4, the insulation property of the gate insulating layer 4 is assured.

From the above, in the embodiment, by forming the sub stack body 6, the inter-wiring short-circuit is effectively prevented without increasing the number of manufacturing processes. Thus, the high-performance TFT structure is easily manufactured.

Similar to the operation and effect on the wiring 3 for the gate electrode, the sub stack body 6, and the wiring 8 for the source electrode, the operation and effect on the gate electrode 2, the main stack body 5, the source electrode 7, and the drain electrode 9 are also obtained for the reason that the main stack body 5 has a layer stack structure (the insulating layer 5X and the semiconductor layer 5Y) similar to that of the sub stack body 6. Therefore, an inter-electrode short-circuit (short-circuit between the gate electrode 2, the source electrode 7, and the drain electrode 9) is also effectively prevented. Thus, the higher-performance TFT structure is manufactured.

In the TFT 11, since the insulating layer 5X is inserted between the gate insulating layer 4 and the semiconductor layer 5Y, the substantial thickness of the insulating layer provided between the gate electrode 2 and the semiconductor layer 5Y increases as compared with the case where the insulating layer 5X is not formed. There is consequently concern that the performance of the TFT 11 may deteriorate. However, the insulating layer 5X is much thinner than the gate insulating layer 4, so that the performances of the TFT 11 (mobility, on-off ratio, and the like) do not largely deteriorate. Rather, as described above, in the case where the insulating layer 5X is formed, a pin hole is buried with the insulating material penetrating the gate insulating layer 4, so that the possibility of occurrence of the inter-electrode short-circuit decreases considerably. Moreover, the insulation property of the gate insulating layer 4 improves due to penetration of the insulating material, so that the insulating layer 5X may be thin. From those facts, even when the insulating layer 5X is formed, the performance of the TFT 11 does not deteriorate extremely. Rather, the possibility of occurrence of the inter-electrode short-circuit decreases considerably, so that the performance of the TFT 11 is stabilized.

The number of layers of the sub stack body 6 is not limited to two but may be three or more. Concretely layer structures (the number of the insulating layer 6X and the semiconductor layer 6Y, the layer stack order, and the like) in this case may be set arbitrarily. The concrete layer structures of the main stack body 5 are also similar to the above. In the TFT 11 of the top contact type, however, to connect the source electrode 7 and the drain electrode 9, at least the semiconductor layer 6Y has to be the uppermost layer.

Figure 8:
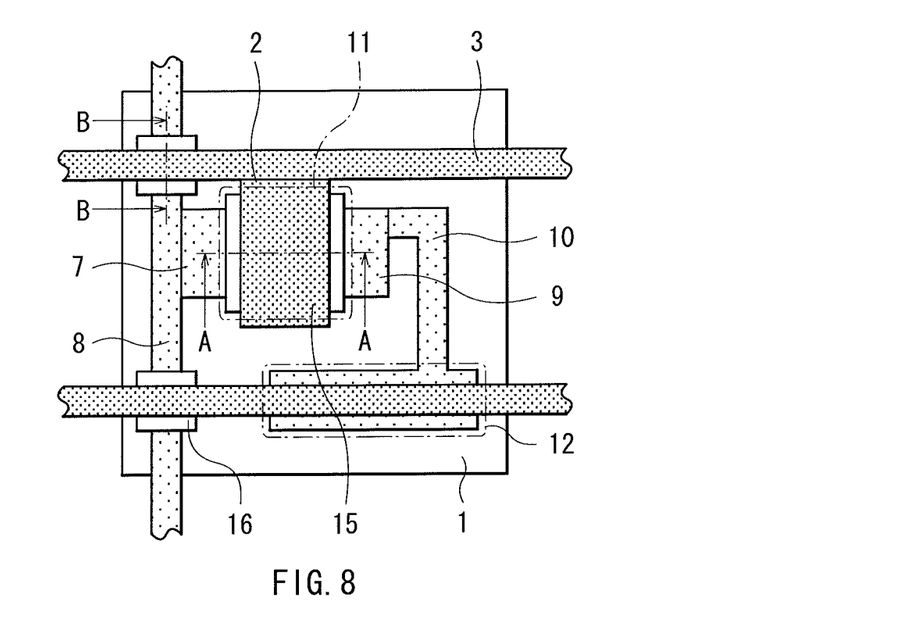
FIG. 8 is a plan view illustrating a modification of the configuration of the thin film transistor structure.
Figure 9A:
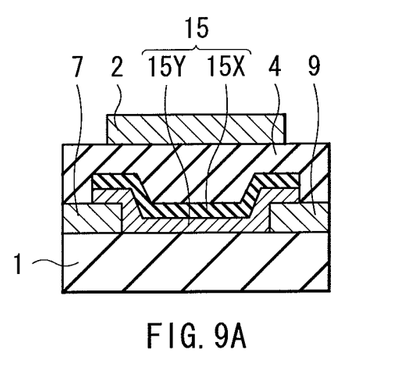
FIGS. 9A and 9B are cross sections taken along line A-A and B-B, respectively, of the thin film transistor structure illustrated in FIG. 8.
Figure 9B:
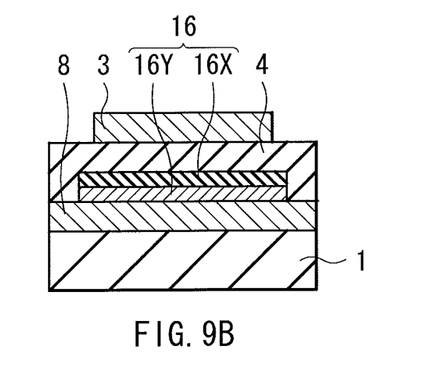

The TFT 11 may be of the top-gate bottom-contact type in which the gate electrode 2 is positioned above the main stack body 15, and the main stack body 15 overlaps the source electrode 7 and the drain electrode 9 as illustrated in FIG. 8 and FIGS. 9A and 9B.

The TFT structure in this case is obtained by, for example, on the substrate 1, stacking the source electrode 7, the wiring 8 for the source electrode, the drain electrode 9, the wiring 10 for the drain electrode, the main stack body 15, a sub stack body 16, the gate insulating layer 4, the gate electrode 2, and the wiring 3 for the gate electrode in this order. The configuration of the main stack body 15 and that of the sub stack body 16 are similar to that of the main stack body 5 and that of the sub stack body 6, respectively, except for the layer stack order. Concretely, the main stack body 15 has, for example, a two-layer structure in which an insulating layer 15X is formed on a semiconductor layer 15Y, and the insulating layer 15X is adjacent to the gate insulating layer 4. The sub stack body 16 has a two-layer structure in which an insulating layer 16X is formed on a semiconductor layer 16Y, and the insulating layer 16X is adjacent to the gate insulating layer 4.

To manufacture such a TFT structure, it is sufficient to employ a procedure similar to that of the bottom-gate top-contact type except for the order of stacking the layers on the substrate 1. In particular, in the case of forming the main stack body 15 and the sub stack body 16, it is sufficient to determine the kind, composition, and the like of the semiconductor material and the insulating material so that the semiconductor layers 15Y and 16Y are formed on the lower side, and the insulating layers 15X and 16X are formed in the upper side by using phase separation. In this case as well, the inter-wiring short-circuit and the inter-electrode short-circuit are effectively prevented without increasing the number of manufacturing processes, so that a high-performance TFT structure is easily manufactured.

The number of layers of the sub stack body 16 is not limited to two but may be three or more similar to the sub stack body 6 mentioned above. Concretely layer structures may be set arbitrarily as long as at least the semiconductor layer 16Y becomes the lowermost layer to be connected to the source electrode 7 and the drain electrode 9. As an example, when a mixed solution is prepared using TIPS pentacene as the semiconductor material, using polyalphamethylstyrene as the insulating material, and using toluene, xylene, mesitylene, or tetralin as the solvent, the sub stack body 16 having the three-layer structure in which the semiconductor layer 16Y, the insulating layer 16X, and the semiconductor layer 16Y are stacked in this order is formed. The main stack body 15 is similarly formed.

2. Example of Applying TFT Structure (To Electronic Device)

Next, an application example of the TFT structure will be described. The TFT structure is applicable to, for example, some electronic devices as will be described below in order.

2-1. Liquid Crystal Display Device

Figure 10:
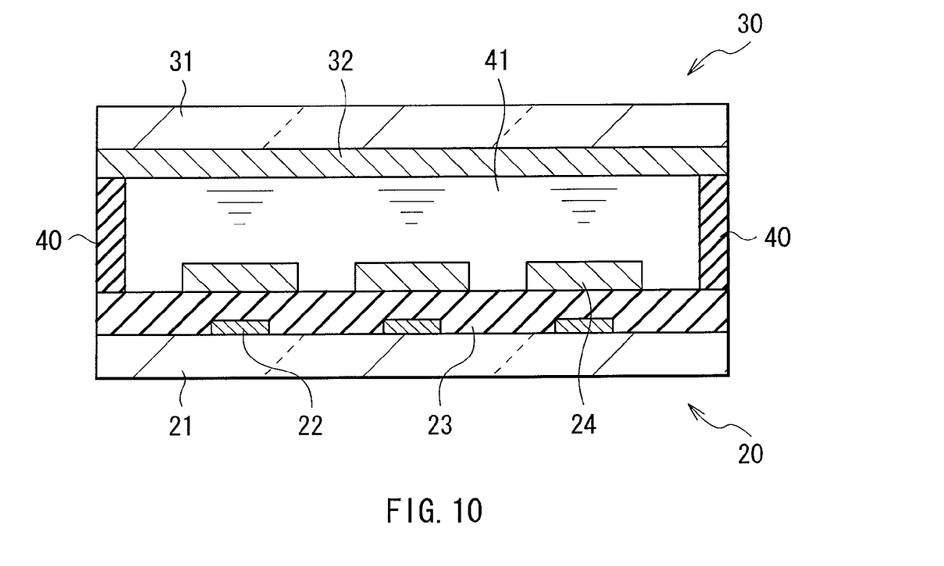
FIG. 10 is a cross section illustrating the configuration of a main part of a liquid crystal display device as an application example of the thin film transistor.
Figure 11:
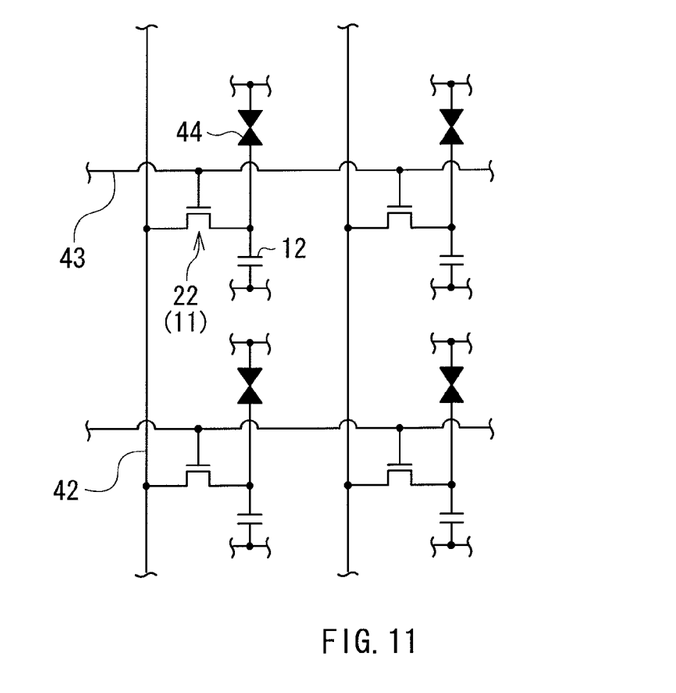
FIG. 11 is a diagram illustrating a circuit configuration of the liquid crystal display device shown in FIG. 10.

The TFT structure is applied to, for example, a liquid crystal display device. FIGS. 10 and 11 illustrate a sectional configuration and a circuit configuration, respectively, of a main part of the liquid crystal display device. A device configuration (FIG. 10) and a circuit configuration (FIG. 11) to be described below are just an example and they may be properly changed.

The liquid crystal display device to be described below is, for example, a transmissive liquid crystal display of an active matrix driving method using the TFT structure. The TFT structure is used as a switching element. In the liquid crystal display device, as shown in FIG. 10, a liquid crystal layer 41 is sealed between a drive substrate 20 and an opposed substrate 30.

In the drive substrate 20, for example, a TFT structure 22, a planarized insulating layer 23, and a pixel electrode 24 are formed in this order on one surface of a supporting substrate 21, and a plurality of TFT structures 22 and pixel electrodes 24 are disposed in a matrix. The number of the TFT structures 22 included in one pixel may be one or more. FIGS. 10 and 11 illustrate, for example, a case where one TFT structure 22 is included in one pixel.

The supporting substrate 21 is made of, for example, a transmissive material such as glass or plastic material, and the TFT structure 22 has a configuration similar to that of the above-described TFT structure. The kinds of the plastic material are, for example, similar to those of the case described with respect to the organic TFT and will be similar in cases to be described below. The planarized insulating layer 23 is made of, for example, an insulating resin material such as polyimide, and the pixel electrode 24 is formed of, for example, a transmissive conductive material such as ITO. The pixel electrode 24 is connected to the TFT structure 22 via a contact hole (not shown) formed in the planarized insulating layer 23.

The opposed substrate 30 is obtained by forming an opposed electrode 32 in an entire face of a supporting substrate 31. The supporting substrate 31 is made of a transmissive material such as glass or plastic material, and the opposed electrode 32 is made of, for example, a transmissive conductive material such as ITO.

The drive substrate 20 and the opposed substrate 30 are disposed so that the pixel electrode 24 and the opposed electrode 32 are opposed to each other while sandwiching the liquid crystal layer 41 and are adhered to each other via a seal material 40. The kind of the liquid crystal molecules included in the liquid crystal layer 41 is arbitrarily selectable.

In addition, the liquid crystal display device may have other components (not shown) such as a retarder, a polarizer, an alignment film, and a backlight unit.

Circuits for driving the liquid crystal display device include, for example, as illustrated in FIG. 11, the TFT structure 22 (the TFT 11 and the capacitor 12) and a liquid crystal display element 44 (an element part including the pixel electrode 24, the opposed electrode 32, and the liquid crystal layer 41). In the circuit, a plurality of signal lines 42 are arranged in the row direction and a plurality of scanning lines 43 are arranged in the column direction, and the TFT structure 22 and the liquid crystal display element 44 are disposed in a position where the signal line 42 and the scanning line 43 cross each other. The places to which the source electrode, the gate electrode, and the drain electrode of the TFT 11 are connected are not limited to those illustrated in FIG. 11 but are arbitrarily changeable. The signal lines 42 and the scanning lines 43 are connected to a not-shown signal line drive circuit (data driver) and a not-shown scanning line drive circuit (scan driver), respectively.

In the liquid crystal display device, when the liquid crystal display element 44 is selected by the TFT 11 in the TFT structure 22 and an electric field is applied across the pixel electrode 24 and the opposed electrode 32, the alignment state of the liquid crystal layer 41 (liquid crystal molecules) changes according to the intensity of the electric field. Consequently, the transmission amount of light (transmittance) is controlled according to the alignment state of the liquid crystal molecules, so that a tone image is displayed.

In the liquid crystal display device, since the TFT structure 22 has a configuration similar to that of the above-described TFT structure, the high-performance liquid crystal display device is easily manufactured. The liquid crystal display device is not limited to that of the transmissive type but may be of the reflection type.

2-2. Organic EL Display Device

Figure 12:
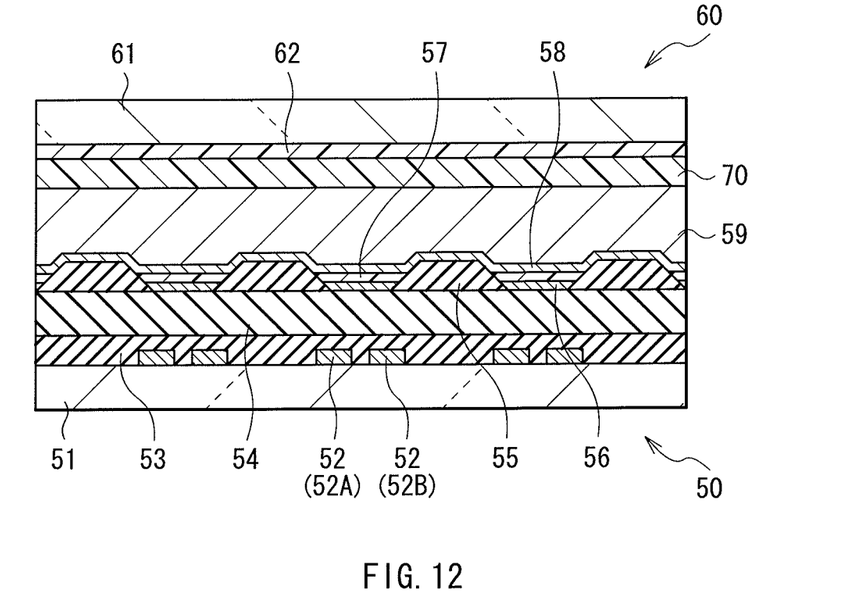
FIG. 12 is a cross section illustrating the configuration of a main part of an organic EL display device as an application example of a thin film transistor.
Figure 13:
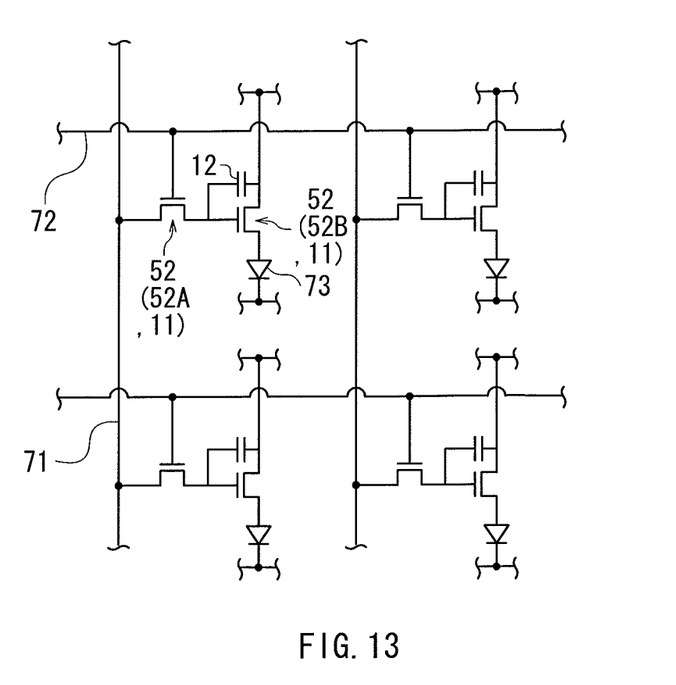
FIG. 13 is a diagram illustrating a circuit configuration of the organic EL display device shown in FIG. 12.

An organic TFT is applied to, for example, an organic EL display device. FIGS. 12 and 13 illustrate a sectional configuration and a circuit configuration, respectively, of a main part of the organic EL display device. A device configuration (FIG. 12) and a circuit configuration (FIG. 13) to be described below are just an example and they may be properly changed.

The organic EL display device to be described below is, for example, an organic EL display of an active matrix driving method using the TFT structure as a switching element. The organic EL display device is obtained by adhering a drive substrate 50 and an opposed substrate 60 to each other via an adhesive layer 70 made of thermo-curing resin or the like and is, for example, of a top emission type of emitting light via the opposed substrate 60.

In the drive substrate 50, for example, a TFT structure 52, a protection layer 53, a planarized insulating layer 54, a pixel isolation insulating layer 55, a pixel electrode 56, an organic layer 57, an opposed electrode 58, and a protection layer 59 are formed in this order on one surface of a supporting substrate 51. A plurality of TFT structures 52, pixel electrodes 56, and organic layers 57 are disposed in a matrix. The number of the TFT structures 52 included in one pixel may be one or more. FIGS. 12 and 13 illustrate, for example, a case where two TFT structures 52 (a TFT structure 52A for selection and a TFT structure 52B for driving) are included in one pixel.

The supporting substrate 51 is made of, for example, a glass or plastic material. Since light is extracted from the opposed substrate 60 in the top emission type, the supporting substrate 51 may be formed of a transmissive material or a non-permeable material. The TFT structure 52 has a configuration similar to that of the above-described TFT structure. The protection layer 53 is made of, for example, a high-polymer material such as polyvinyl alcohol (PVA) or poly-para-xylelen. The planarized insulating layer 54 and the pixel isolation insulating layer 55 are formed of, for example, an insulating resin material such as polyimide. Preferably, the pixel isolation insulating layer 55 is formed of a photosensitive resin material which is capable of being molded by photo-patterning, reflow, or the like to simplify a forming process and to form the layer in a desired shape. When sufficient flatness is obtained by the protection layer 53, the planarized insulating layer 54 may not be provided.

The pixel electrode 56 is formed of, for example, a reflecting material such as aluminum, silver, titanium, chromium, or the like, and the opposed electrode 58 is formed of a transmissive material such as ITO or IZO. The opposed electrode 58 may be formed of a transmissive metal material such as calcium (Ca) or an alloy of the transmissive metal material, or a transmissive organic conductive material such as PEDOT. The organic layer 57 includes a light emitting layer for emitting light of red, green, blue, or the like and may have a layer stack structure including, as necessary, a hole transport layer and an electron transport layer. The material for forming the light emitting layer may be selected arbitrarily in accordance with color of light to be emitted. The pixel electrodes 56 and the organic layer 57 are disposed in a matrix while being isolated by the pixel isolation insulating layers 55. On the other hand, the opposed electrode 58 continuously extends while being opposed to the pixel electrodes 56 with the organic layers 57 in between. The protection layer 59 is made of, for example, a transmissive dielectric material such as silicon nitride (SiN). The pixel electrode 56 is connected to the TFT structure 52 via a contact hole (not shown) formed in the protection layer 53 and the planarized insulating layer 54.

The opposed substrate 60 is obtained by, for example, providing a color filter 62 on one face of a supporting substrate 61. The supporting substrate 61 is made of a transmissive material such as glass or plastic material, and the color filter 62 has a plurality of color regions corresponding to colors of light generated in the organic layers 57. However, the color filter 62 may not be provided.

Circuits for driving the organic EL display device include, for example, as illustrated in FIG. 13, the TFT structure 52 (the TFT structure 52A for selection and the TFT structure 52B for driving) and an organic EL display element 73 (an element part including the pixel electrode 56, the organic layer 57, and the opposed electrode 58). In the circuit, the TFT structures 52 and the organic EL display elements 73 are disposed in positions where a plurality of signal lines 71 and a plurality of scanning lines 72 cross each other. The places to which the source electrodes, the gate electrodes, and the drain electrodes of the TFTs 11 in the TFT structure 52A for selection and the TFT structure 52B for driving are connected are not limited to those illustrated in FIG. 13 but are arbitrarily changeable.

In the EL display device, for example, when the organic EL display element 73 is selected by the TFT 11 in the TFT structure 52 for selection, the organic EL display element 73 is driven by the TFT 11 in the TFT structure 52B for driving. Consequently, when an electric field is applied across the pixel electrode 56 and the opposed electrode 58, light is generated in the organic layer 57. In this case, for example, light of red, green, and blue is generated in three neighboring organic EL display elements 73. Synthesized light of the light rays is released to the outside via the opposed substrate 60 so that a tone image is displayed.

In the organic EL display device, the TFT structure 52 has a configuration similar to that of the above-described TFT structure, so that the high-performance organic EL display device is easily manufactured.

The organic EL display device is not limited to that of the top emission type but may be of the bottom emission type of releasing light via the drive substrate 50 or the dual emission type of releasing light via both of the drive substrate 50 and the opposed substrate 60. In this case, the electrode on the side of releasing light out of the pixel electrode 56 and the opposed electrode 58 is formed of a transmissive material, and the electrode on the side of releasing no light is formed of a reflective material.

2-3. Electronic Paper Display Device

Figure 14:
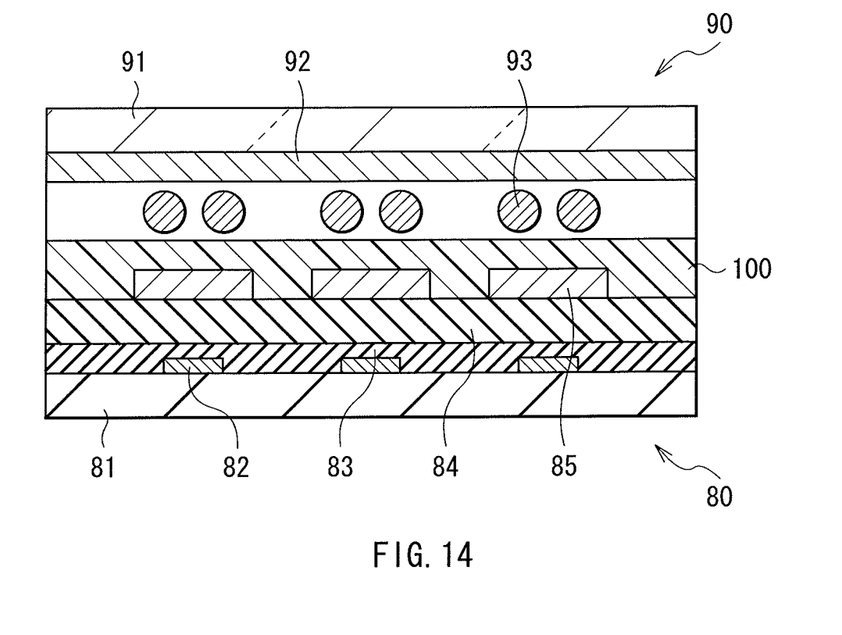
FIG. 14 is a cross section illustrating the configuration of a main part of an electronic paper display device as an application example of a thin film transistor.

The TFT structure is applied to, for example, an electronic paper display device. FIG. 14 illustrates a sectional configuration of the electronic paper display device. A device configuration (FIG. 14) to be described below and a circuit configuration to be described with reference to FIG. 11 are just an example and they may be properly changed.

The electronic paper display device to be described below is, for example, an electronic paper display of an active matrix driving method using the TFT structure as an element for switching. The electronic paper display device is obtained by, for example, adhering a drive substrate 80 and an opposed substrate 90 including a plurality of electrophoretic elements 93 with an adhesive layer 100 in between.

In the drive substrate 80, for example, a TFT structure 82, a protection layer 83, a planarized insulating layer 84, and a pixel electrode 85 are formed in this order on one surface of a supporting substrate 81, and a plurality of TFT structures 82 and pixel electrodes 85 are disposed in a matrix. The supporting substrate 81 is made of, for example, glass, plastic material, or the like, and the TFT structure 82 has a configuration similar to that of the above-described TFT structure. The protection layer 83 and the planarized insulating layer 84 are made of, for example, an insulating resin material such as polyimide, and the pixel electrode 85 is formed of, for example, a metal material such as silver. The pixel electrode 85 is connected to the TFT structure 82 via a contact hole (not shown) formed in the protection layer 83 and the planarized insulating layer 84. When sufficient flatness is obtained by the protection layer 83, the planarized insulating layer 84 may not be provided.

In the opposed substrate 90, for example, an opposed electrode 92 and a layer including a plurality of electrophoretic elements 93 are stacked in this order on one face of a supporting substrate 91, and the opposed electrode 92 is formed on the entire face. The supporting substrate 91 is made of a transmissive material such as glass or plastic material, and the opposed electrode 92 is made of, for example, a transmissive conductive material such as ITO. The electrophoretic element 93 is obtained by, for example, encapsulating an insulating liquid in which charged particles are dispersed into a microcapsule. The charged particles include, for example, black particles such as graphite fine particles and white particles such as titanium oxide fine particles.

Circuits for driving the electronic paper display device have a configuration similar to that of the circuits in the liquid crystal display device illustrated in FIG. 11. The circuits of the electronic paper display device include, in place of the TFT structure 22 and the liquid crystal display element 44, the TFT structure 82 and electronic paper display elements (an element part including the pixel electrode 85, the opposed electrode 92, and the electrophoretic elements 93).

In the electronic paper display device, when an electronic paper display element is selected by the TFT 11 in the TFT structure 82 and an electric field is applied across the pixel electrode 85 and the opposed electrode 92, the black particles or white particles in the electrophoretic element 93 are attracted by the opposed electrode 92 in accordance with the electric field. Consequently, the contrast is expressed by the black particles and the white particles, so that a tone image is displayed.

In the electronic paper display device, the TFT structure 82 has a configuration similar to that of the above-described TFT structure, so that the high-performance electronic paper display device is easily manufactured.

Although the present invention has been described above by the embodiments, the invention is not limited to the modes described in the embodiments but may be variously modified. For example, the structure of a TFT in the thin film transistor structure of the present invention is not limited to the bottom-gate top-contact type or the top-gate bottom-contact type but may be a top-gate top-contact type or a bottom-gate bottom-contact type. Also in those cases, similar effects are obtained.

For example, an electronic device to which the thin film transistor structure of the present invention is applied is not limited to the liquid crystal display device, the organic EL display device, or the electronic paper display device but may be other display devices. An example of the other display devices is an MEMS (Micro Electro Mechanical Systems) display unit (MEMS type display).

Further, for example, the thin film transistor structure of an embodiment of the invention may be applied to an electronic device other than a display device. Examples of such an electronic device include a sensor matrix, a memory sensor, an RFID (Radio Frequency Identification) tag, and a sensor array.

The present application contains subject matter related to that disclosed in Japanese Priority Patent Application JP 2010-037284 filed in the Japanese Patent Office on Feb. 23, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A thin film transistor structure comprising:
    a first electrode;
    second and third electrodes apart from each other in a hierarchical level different from that of the first electrode, wherein the second and third electrodes are in direct contact with an interlayer insulating layer;
    first, second, and third wirings connected to the first, second, and third electrodes, respectively;
    a main stack body disposed so as to be opposed to the first electrode with the interlayer insulating layer in between, and the main stack body being disposed between the first electrode and the second electrode and between the first electrode and the third electrode; and
    a sub stack body including a sub stack insulating layer and a sub stack semiconductor layer, disposed so as to be opposed to the first wiring with the interlayer insulating layer in between, between the first and second wirings in a position where the first and second wirings overlap.

2. The thin film transistor structure according to claim 1, wherein the sub stack insulating layer and the sub stack semiconductor layer are obtained by phase separation which occurs in a film formed by using a solution containing an insulating material and a semiconductor material.

3. The thin film transistor structure according to claim 1, wherein one or both of the sub stack insulating layer and the sub stack semiconductor layer are made of an organic material.

4. The thin film transistor structure according to claim 1, wherein the sub stack body is positioned in a same hierarchical level as the main stack body.

5. The thin film transistor structure according to claim 1, wherein the main stack body has a same layer stack structure as the sub stack body.

6. The thin film transistor structure according to claim 1, wherein the sub stack insulating layer is thinner than the interlayer insulating layer.

7. The thin film transistor structure according to claim 1, wherein the sub stack insulating layer is adjacent to the interlayer insulating layer.

8. The thin film transistor structure according to claim 1, wherein main stack body comprises a main stack insulating layer and a main stack semiconductor layer.

9. The thin film transistor structure according to claim 1, wherein the main stack semiconductor layer is in ohmic-contact with both the second and third electrodes.

10. An electronic device having a thin film transistor structure comprising:
    a first electrode;
    second and third electrodes apart from each other in a hierarchical level different from that of the first electrode, wherein the second and third electrodes are in direct contact with an interlayer insulating layer;
    first, second, and third wirings connected to the first, second, and third electrodes, respectively;
    a main stack body disposed so as to be opposed to the first electrode with the interlayer insulating layer in between, and the main stack body being disposed between the first electrode and the second electrode and between the first electrode and the third electrode; and
    a sub stack body including a sub stack insulating layer and a sub stack semiconductor layer and disposed so as to be opposed to the first wiring with the interlayer insulating layer in between, between the first and second wirings in a position where the first and second wirings overlap.

11. The electronic device according to claim 10, wherein the sub stack insulating layer and the sub stack semiconductor layer are obtained by phase separation which occurs in a film formed by using a solution containing an insulating material and a semiconductor material.

12. The electronic device according to claim 10, wherein one or both of the sub stack insulating layer and the sub stack semiconductor layer are made of an organic material.

13. The electronic device according to claim 10, wherein the sub stack body is positioned in a same hierarchical level as the main stack body.

14. The electronic device according to claim 10, wherein the main stack body has a same layer stack structure as the sub stack body.

15. The electronic device according to claim 10, wherein the sub stack insulating layer is thinner than the interlayer insulating layer.

16. The electronic device according to claim 10, wherein the sub stack insulating layer is adjacent to the interlayer insulating layer.

17. The electronic device according to claim 10, wherein main stack body comprises a main stack insulating layer and a main stack semiconductor layer.

18. The electronic device according to claim 17, wherein the main stack semiconductor layer is in ohmic-contact with both the second and third electrodes.

* * * * *